(12) United States Patent
Sheredy

(10) Patent No.: US 8,086,935 B1
(45) Date of Patent: Dec. 27, 2011

(54) SOFT ERROR CORRECTION FOR A DATA STORAGE MECHANISM

(75) Inventor: Joseph Sheredy, San Jose, CA (US)

(73) Assignee: Marvell International Ltd. (BM)

( * ) Notice: Subject to any disclaimer, the term of this patent is extended or adjusted under 35 U.S.C. 154(b) by 1225 days.

(21) Appl. No.: 11/820,391

(22) Filed: Jun. 19, 2007

(51) Int. Cl.
*G11B 20/18* (2006.01)

(52) U.S. Cl. ........................................ 714/760; 714/769

(58) Field of Classification Search .................. 714/760, 714/769
See application file for complete search history.

(56) References Cited

U.S. PATENT DOCUMENTS

| | | | | |
|---|---|---|---|---|
| 5,321,703 A * | 6/1994 | Weng | ............... | 714/797 |
| 5,490,149 A * | 2/1996 | Nylander-Hill | ............... | 714/5.1 |
| 6,044,487 A * | 3/2000 | Li | ............... | 714/797 |
| 6,678,197 B1* | 1/2004 | Perner et al. | ............... | 365/206 |
| 6,920,599 B2* | 7/2005 | Kuwamura | ............... | 714/769 |
| 7,131,052 B2* | 10/2006 | Hassner et al. | ............... | 714/787 |
| 7,506,199 B2* | 3/2009 | Ueno | ............... | 714/6.24 |
| 7,634,706 B1* | 12/2009 | Chen et al. | ............... | 714/760 |
| 7,752,489 B2* | 7/2010 | Deenadhayalan et al. | ... | 714/6.12 |
| 7,787,203 B2* | 8/2010 | Biskeborn et al. | ............... | 360/39 |
| 7,885,028 B2* | 2/2011 | Tang et al. | ............... | 360/53 |
| 7,900,125 B1* | 3/2011 | Liu et al. | ............... | 714/799 |

* cited by examiner

*Primary Examiner* — Stephen Baker

(57) ABSTRACT

An apparatus and method are disclosed for correcting errors in data obtained from read operations on a storage medium. Errors that occur in a minority of read operations for the data are corrected by a voting technique. The data may then be processed with error correcting code to correct errors that occur in a majority of read operations.

45 Claims, 8 Drawing Sheets

SOFT ERROR CORRECTION FOR A DATA STORAGE MECHANISM

FIELD OF THE INVENTION

The present disclosure relates to correcting errors introduced in data during a read operation. More specifically, a technique is disclosed for correcting errors that occur in a minority of data sets obtained by repeating a read operation on a set of stored data.

BACKGROUND

Disk drives are configured to read data by scanning the magnetic surface of a disk. Whether data is accurately read by the disk drive is dependent upon several factors, including the condition of the surface of the disk and the absence/presence of foreign articles, such as dust, on the disk. Errors may be introduced into the data during a read operation because of surface abnormalities, abrasions, dust, or other obstruction between the disk and the read-head.

Data errors include hard errors and soft errors. Hard errors, by definition, repeat with every read operation. Hard errors usually occur because of a persistent or permanent condition of the disk, such as an abrasion. Soft errors are data errors that do not necessarily repeat with every read operation, although they may reoccur. Soft errors may be caused by transient dust on the disk or other non-permanent conditions. Error correction coding is a technique that checks for and/or corrects hard and soft errors.

In the technique, the original data is broken up into groups (typically corresponding to the size of a disk sector) and an error correcting code (ECC) is derived for each group. The ECC is based upon the data and can be used to correct errors introduced during a read operation, provided that the errors do not exceed the correction capability of the ECC. The data and the ECC are written to the disk for use during the read operation.

The disk drive is configured to use the ECC to correct errors that arise during the read operation. In general, the ability of the disk drive to correct data errors using the ECC is limited by the size of the area of data that includes all of the errors, called the error zone. It would be desirable to provide a technique to reduce the size of the error zone to increase the likelihood that errors can be corrected by ECC.

SUMMARY

The present invention is defined by the claims and nothing in this section should be taken as a limitation on those claims.

Correcting soft errors in data obtained from a read operation to decrease the size of the error zone may increase the likelihood that the remaining errors will be corrected by an ECC processor.

In a preferred version of the invention a plurality of data sets, referred to collectively as constituent data, are obtained by a plurality of read operations on the same set of data in a storage medium. A tally is taken of the number of logic 1 (and/or 0) states at each (parallel) position through the constituent data. A new set of data is derived based upon a "vote" at each bit position. The state of each position in the new set of data is set according to the majority logic state at each position in the constituent data. Errors in the new set of data may then be corrected by an ECC processor.

The preferred embodiments will now be described with reference to the attached drawings.

DETAILED DESCRIPTION OF THE PRESENTLY PREFERRED EMBODIMENTS

Figure 1:
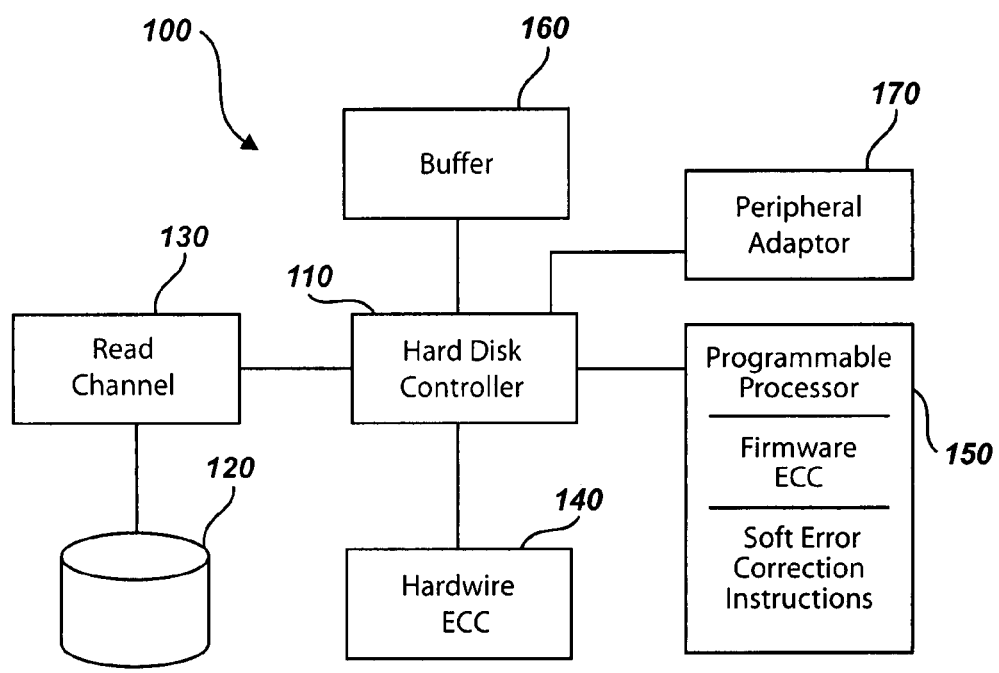
FIG. 1 is a system diagram of a disk drive that implements a version of the invention for correcting errors in data obtained by a read operation on a storage medium.

FIG. 1 shows a system diagram of a disk drive 100 that implements a version of the invention for processing data obtained from read operations on a hard disk 120. Although the illustrated disk drive 100 is configured to read a hard disk, it is to be understood that versions of the invention may be implemented in other devices such as optical, compact, and floppy disk drives.

The disk drive 100 has a hard disk controller 110 in communication with the hard disk 120 through a read channel 130 having a read-head (not shown). During a disk read operation the read-head scans the magnetized surface of the hard disk 120 and the read channel 130 converts magnetic flux changes into data bits, which are communicated to the hard disk controller 110. The hard disk controller 110 receives the bits and processes the bits as data and ECC bytes. A hardwire processor 140, or other type of processor, is configured to process the data and ECC bytes to correct data errors that may have been introduced during the read operation. The hardwire processor 140 may implement the Reed-Solomon ECC scheme for correcting data errors, as an example. Alternatively, other convolution or block ECCs may be implemented. If hardwire ECC processing corrects all data errors, the data is communicated to a peripheral adaptor 170, such as a host adaptor, controller or other device.

If hardwire ECC processing does not correct all of the data errors, the data sector is re-read and the re-read data is communicated to the hardwire processor 140. If the data continues to have errors after several (e.g., 51) re-read and hardwire processor 140 correction cycles, the disk drive 100 communicates the data to a programmable processor 150 configured to execute ECC instructions. The ECC instructions may be implemented in ECC firmware, as an example. Programmable ECC processing utilizes information about the disk and may correct error zones that are larger than error zones that can be corrected by the hardwire processor 140. Techniques known in the art or later developed that use information about a disk to correct data errors may be implemented in the ECC instructions.

If the errors are not corrected by the programmable processor 150 after a first attempt the disk drive 100 re-reads the data sector. The re-read data is communicated to the hardwire processor 140 and to the programmable processor 150 for respective ECC processing.

If subsequent data re-read and ECC processing attempts (e.g., 51 attempts) do not provide a set of error free data, the disk drive 100 executes a soft-error correction technique aimed at reducing or eliminating soft data errors. A product of the soft-error correction technique is a set of derived data that represents the group of data in the storage medium. The derived data is based upon several sets of data from read operations on the set of stored data in the storage medium. In one version, fifty-one sets of data obtained from read operations on the set of stored data are compared to derive the derived data set. The fifty-one data sets may be acquired from a buffer 160 that has recorded data from previous read operations on the set of stored data. The several sets of data may be referred to collectively as constituent data.

The soft-error correction technique is based upon the premise that soft errors appear in only a minority of data reads and can be identified and removed by comparing the data from the several read operations. The state (logic 1 or 0) of each bit in the derived data is set according to the majority state at its parallel (same) bit position through the constituent data sets.

Errors that remain in the derived data are likely only hard errors that appeared in a majority or all of the constituent data sets. Typically, an error zone encompassing only hard errors is smaller than an error zone encompassing both hard and soft errors. The smaller error zone in the derived data increases the probability that the errors can be corrected by hardwire or firmware ECC. The derived data may be processed by hardwire or firmware ECC to correct the remaining errors.

Figure 2:
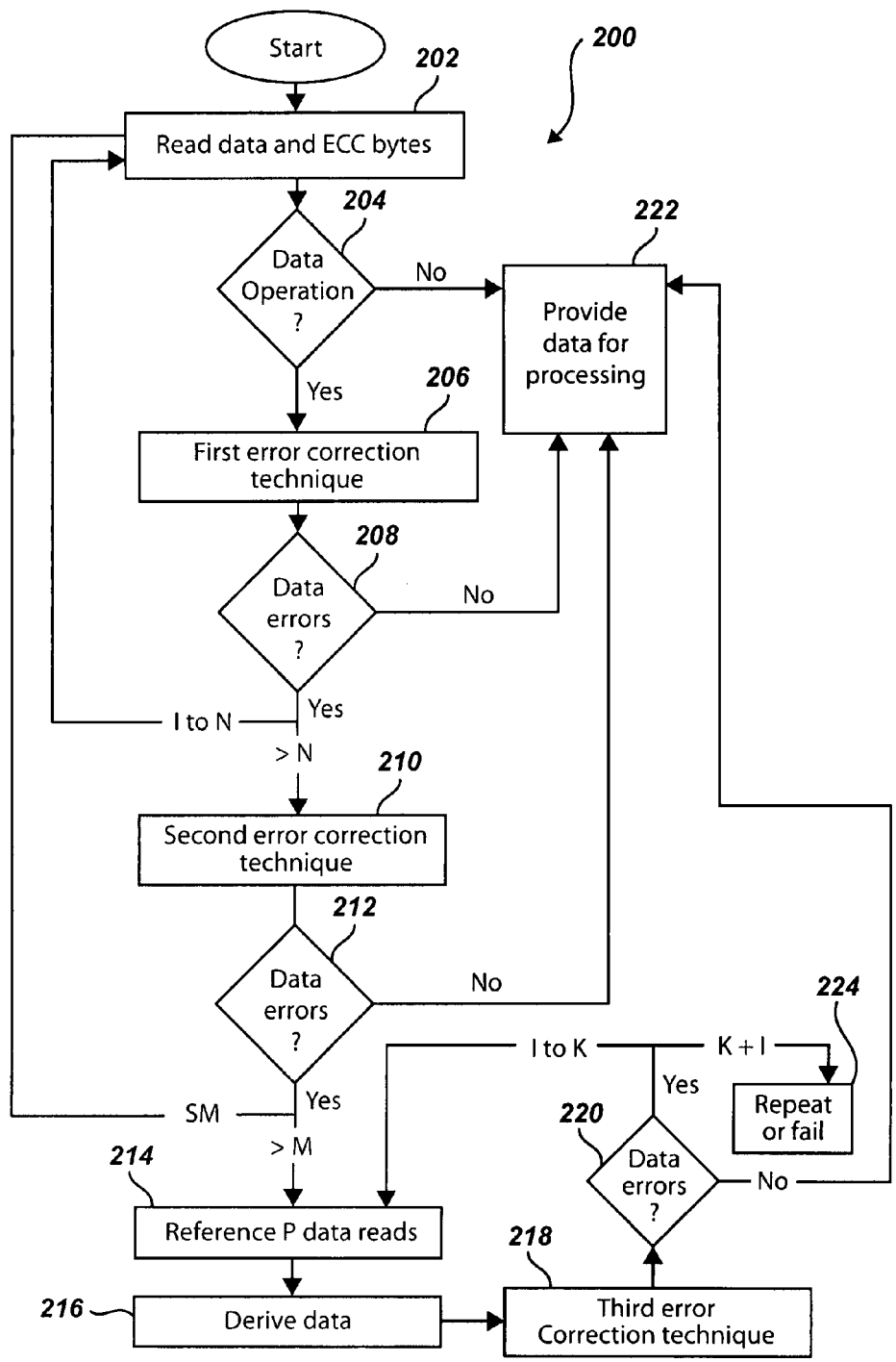
FIG. 2 is a flow chart showing acts for processing data read from a storage medium. The acts implement a version of the invention for correcting soft data errors.
Figure 3A:
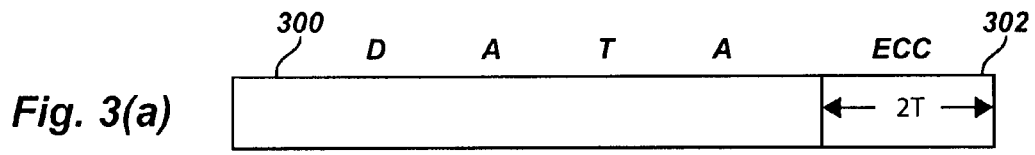
FIG. 3(a) illustrates information obtained from a read operation of a disk drive.

A second version of the invention is to a method for processing data obtained by a read operation on a storage medium, such as a hard disk. FIG. 3(a) illustrates data 300 and ECC information 302 obtained from the read operation and FIG. 2 shows acts 200 for checking and/or correcting the data 300.

The disk drive 100 obtains the data 300 and the ECC information 302 by a read operation (Act 202) on a data set in the storage medium and determines whether the data 300 has errors (Act 204). If the data 300 has no errors, it is provided for processing (Act 222). If the data 300 has errors, it is provided for correction by a first error correction technique (Act 206). The first error correction technique 206 may be implemented by a hardwire ECC processor (e.g., 140). The disk drive 100 is configured to determine whether the data provided by the first error correction technique (Act 206) has errors (Act 208). The hardwire ECC processor and the disk drive 100 may implement design configuration(s) known in the art to implement the first error correction technique and error check. The checked data is either provided for processing (Act 222, no errors) or the data set is re-read (to Act 202).

In a preferred version, Acts 202, 204, 206, and 208 are repeated until no errors are detected in the data 300 or up to a maximum number of attempts (N), whichever comes first. In one example, Acts 202, 204, 206 and 208 are repeated up to 51 times in an attempt to obtain error free data. If errors are present throughout the N attempts, the data is provided for correction by a second error correction technique (Act 210). The second error correction technique (Act 210) may be implemented by a programmable ECC processor (e.g., 150, firmware ECC processor) that utilizes information about the disk to correct errors. The programmable ECC processor may implement one or more program designs known in the art for correcting data errors using information about the disk to correct errors.

Figure 3B:
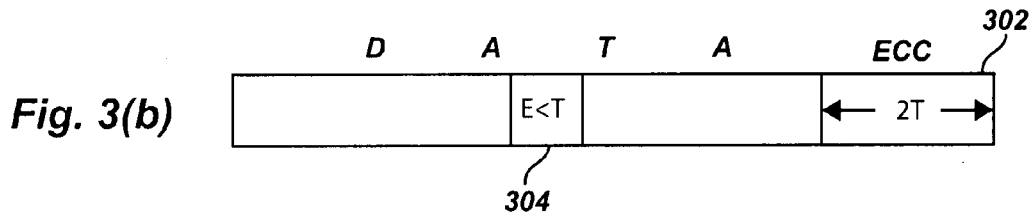
FIG. 3(b) illustrates data having an error zone of a first size.

Preferably, the first error correction technique is suitable for hardwire processing to correct data errors confined to an error zone having up to "T" symbols in data having "2T" ECC symbols. Such an error zone 304 "E" is illustrated in FIG. 3(b).

Figure 3C:
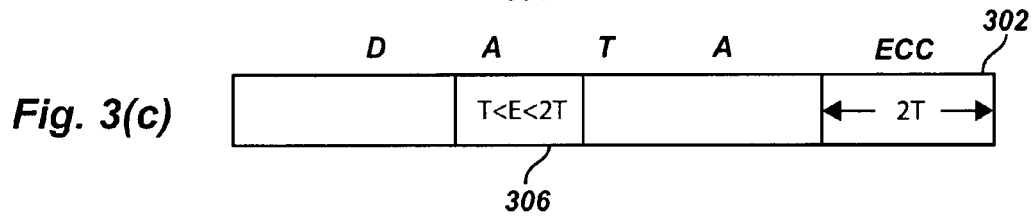
FIG. 3(c) illustrates data having an error zone of a second size.

Preferably, the second error correction technique is implemented by a programmable processor configured to correct data errors confined to an error zone having up to "2T" symbols. Such an error zone 306 is shown in FIG. 3(c). The second error correction technique may utilize information about the storage medium to achieve the greater error correction capacity. Acts 202, 204, 206, 208, 210, and 212 may be repeated until no errors are detected in one of the data sets or up to a maximum number of attempts (M), whichever comes first.

If the data has errors throughout the M attempts, acts are taken in accord with a method to derive a set of data for the stored data set (Act 216). The derived data set is based upon constituent data obtained by data read operations on the stored data set (Act 214). In a preferred version of the method, a tally is taken of the logic 1 (and/or 0) states at parallel positions in the plurality of data sets. The derived data set is based upon a "vote" at each bit position. The bits of the derived data set are assigned values according to the majority logic state at each position.

By way of an example that is not to be read as a limitation on the scope of the invention, the Acts of FIG. 2 may be executed with N=1, M=2, and P=3 to provide the exemplary data sets of FIGS. 3(d) to 3(g).

Figure 3D:
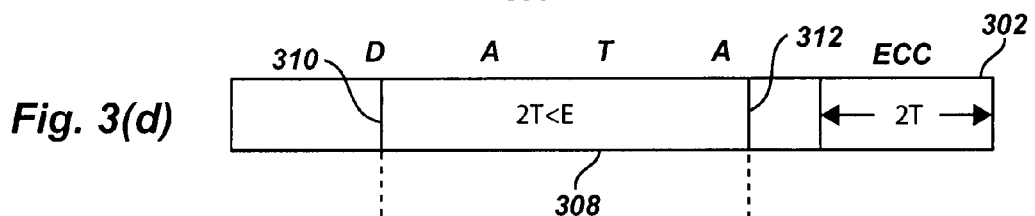
FIG. 3(d) illustrates data having an error zone of a third size.
Figure 3E:
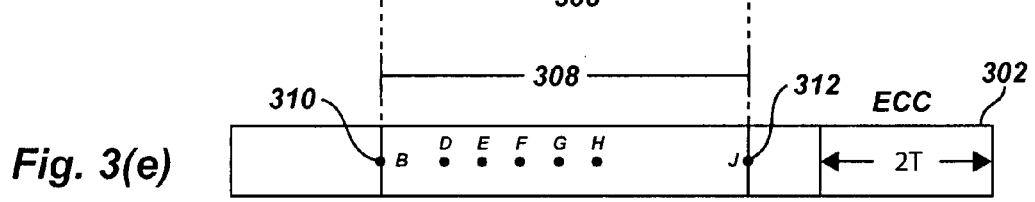
FIGS. 3(e) to 3(g) illustrate errors in exemplary data sets obtained from three read operations on a set of data from a storage medium.

FIG. 3(d) shows an example of data from a first data read operation on an exemplary data set in a storage medium. The data has an error zone 308 greater than 2T. The error zone 308 is bounded by a left border 310 and a right border 312. FIG. 3(e) shows an example of data error positions from the data read operation of FIG. 3(d). Data error B defines the left border and data error J defines the right border. The error zone 308 includes data errors D, E, F, G, and H. The error zone 308 is outside of the capacity of the first error correction technique 206 (greater than T). Thus, the stored data set is read a second time.

Figure 3F:
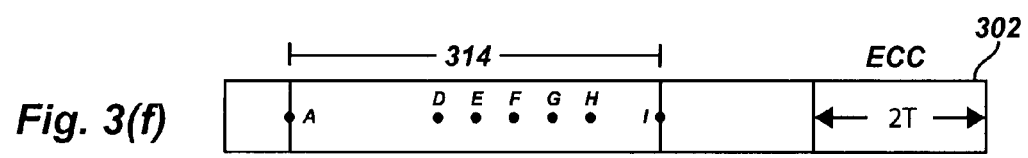

FIG. 3(f) shows an example of data from a second data read operation on the stored data set. In this read operation the error zone 314 is bounded by data error A on the left and data error I on the right. The error zone 314 also includes data errors D, E, F, G, and H. The error zone 314 is outside the capacity of the first error correction technique 206 (greater than T) and the second error correction technique 210 (greater than 2T). Thus, the data group is read a third time.

Figure 3G:
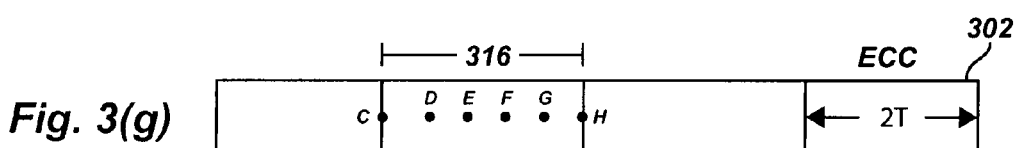
Figure 3H:
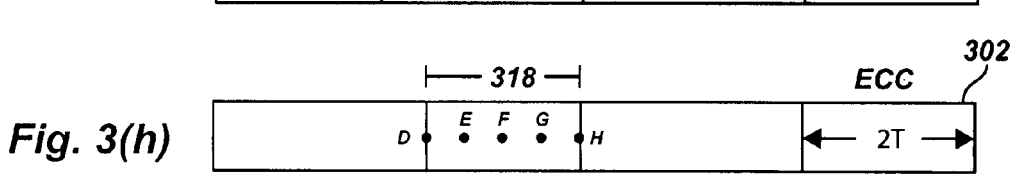
FIG. 3(h) illustrates an example of a derived data set based upon the data sets of FIGS. 3(e) to 3(g).
Figure 4A:
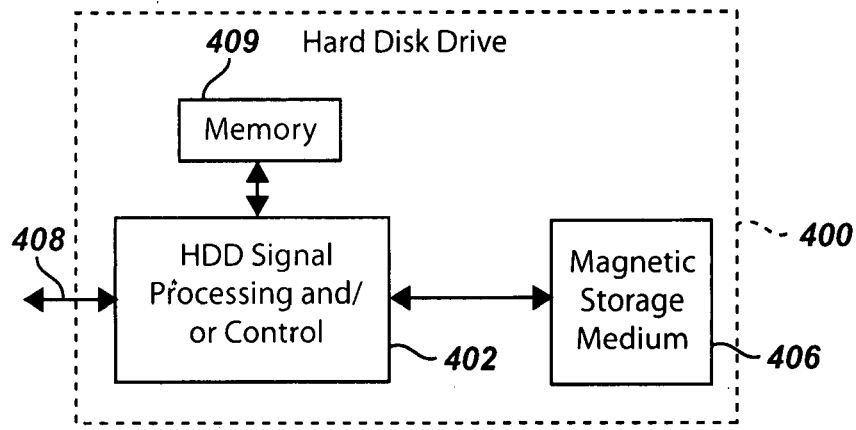
FIG. 4(a) is a functional block diagram of a hard disk drive.
Figure 4B:
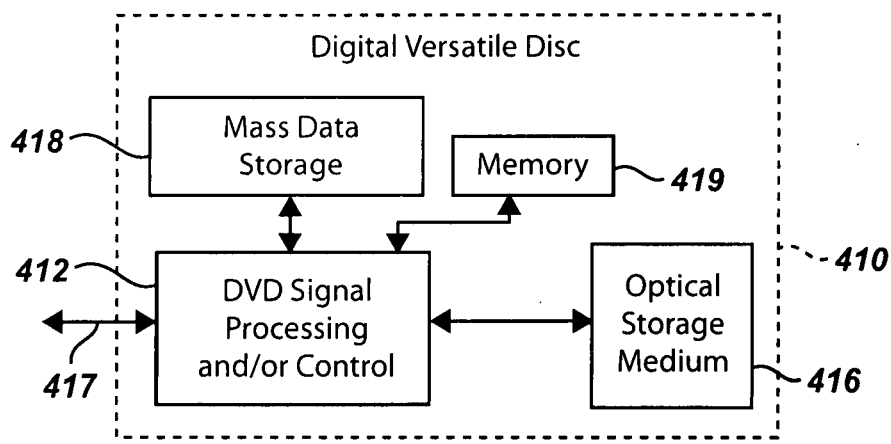
FIG. 4(b) is a functional block diagram of a digital versatile disk (DVD).
Figure 4C:
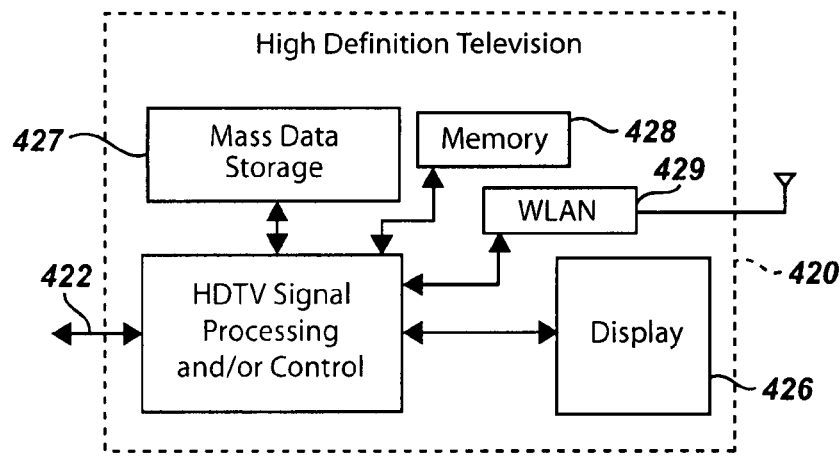
FIG. 4(c) is a functional block diagram of a high definition television.
Figure 4D:
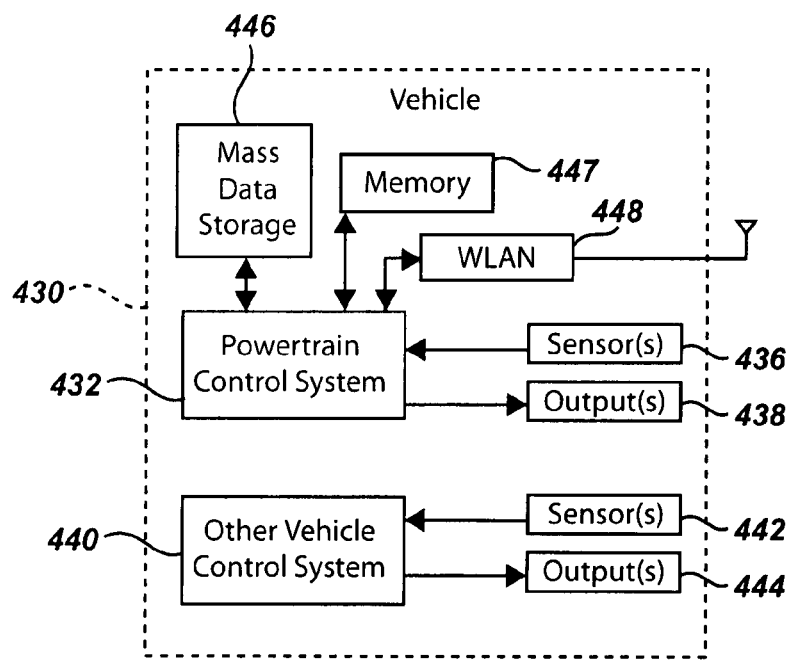
FIG. 4(d) is a functional block diagram of a vehicle control system.
Figure 4E:
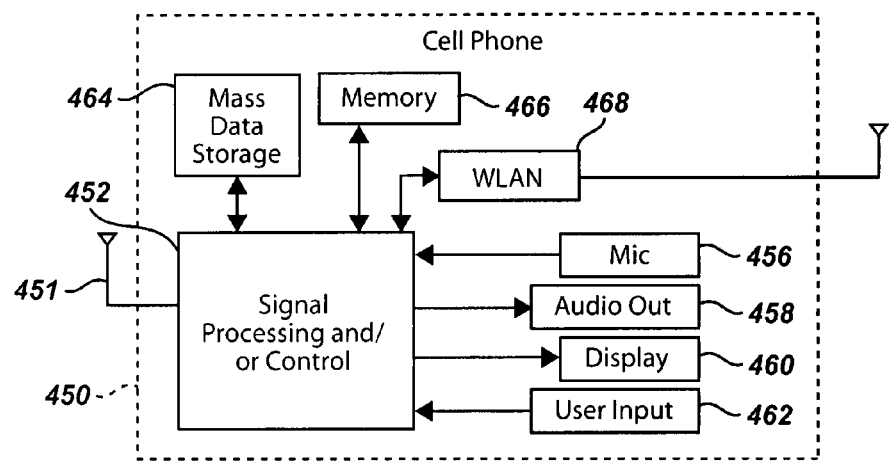
FIG. 4(e) is a functional block diagram of a cellular phone.
Figure 4F:
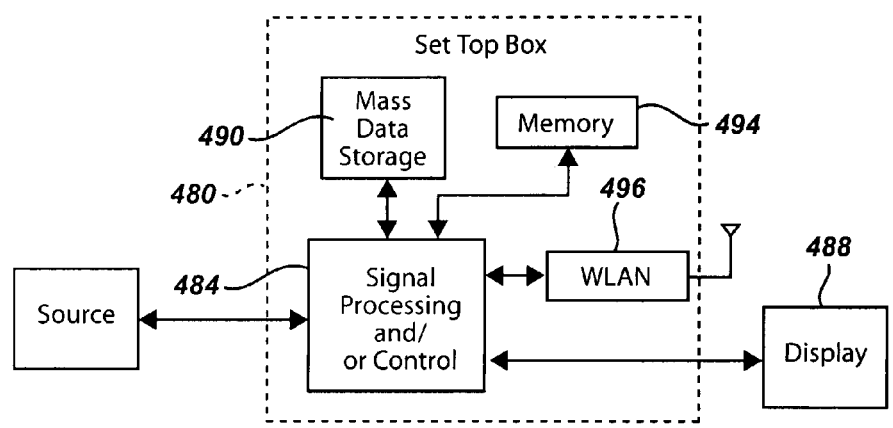
FIG. 4(f) is a functional block diagram of a set top box.
Figure 4G:
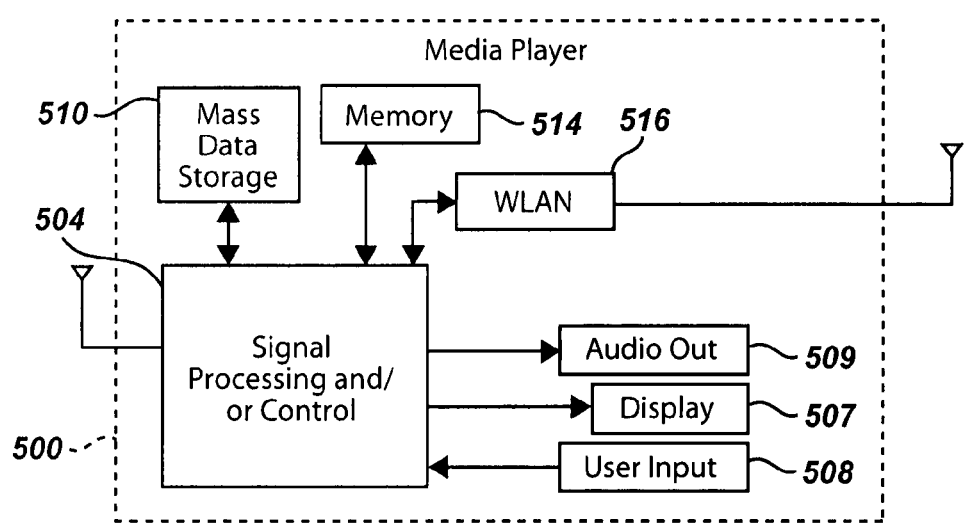
FIG. 4(g) is a functional block diagram of a media player.
Figure 4H:
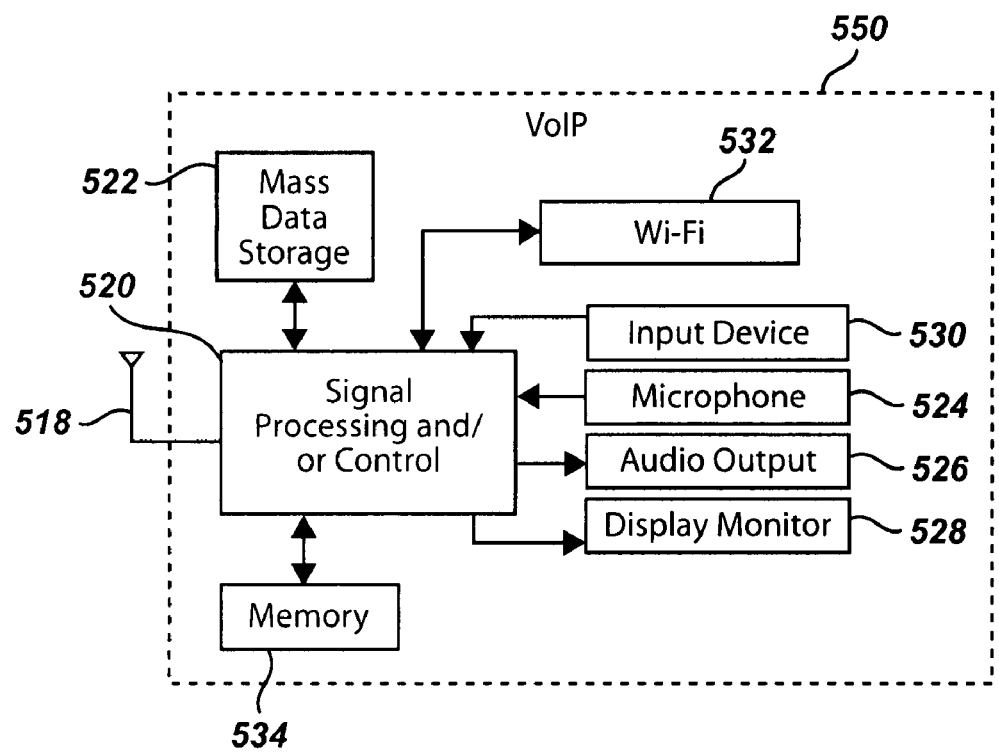
FIG. 4(h) is a functional block diagram of a Voice over Internet Protocol phone.

FIG. 3(g) shows an example of data from a third data read operation on the stored data set. The error zone 316 is bounded by data error C on the left and data error H on the right. The error zone 316 includes data errors D, E, F, and G. The error zone 316 is outside the correction capacity of the first and second error correction techniques, 206 and 210 respectively (greater than 2T). After the third data read operation, the number of data reads (three) is greater than M.

At Acts 214 and 216 a vote is taken from each bit position in FIGS. 3(e) to 3(g) to derive the data set representing the stored data set. FIG. 3(*h*) illustrates parts of the derived data set. Data errors A, B, C, I, and J appear in a minority of the data reads and have been voted out of the derived data set. The error zone 318 in the derived data set has data errors D, E, F, G, and H, which appear in all of the data reads. In this example, the derived data error zone 318 is less than 2T.

The disk drive 100 processes the derived data set by a third error correction technique (Act 218) to attempt to correct any remaining errors. In the preferred version of the invention the second error correction technique (Act 210) and the third error correction technique (Act 218) are the same and are implemented by the same firmware program.

After the third error correction technique (Act 218) the disk drive 100 determines whether the data has errors (Act 220). If the data does not have errors, it may be provided for processing (Act 222). If the data has errors, the disk drive 100 may provide a signal indicating so.

In one version, Acts 214, 216, 218, and 220 are repeated up to a maximum number of times (K) if errors continue to be detected in the data after the third error correction technique (Act 218). For example, if K=5, then Acts 214, 216, 218, and 220 are repeated up to five times if the data has errors after being processed by the third error correction technique (Act 218). If after repeating Acts 214, 216, 218, and 220 K times the data still has errors, the disk drive 100 may communicate a fail signal or repeat query (Act 224) to the peripheral adaptor 170 or other device.

In another version, Acts 214, 216, 218, and 220 are performed only once and not repeated if the data has errors after the third error correction technique (Act 218).

Referring now to FIGS. 4(*a*) to 4(*h*), various exemplary implementations of the present invention are shown. Referring to FIG. 4(*a*), the present invention may be implemented in a hard disk drive (HDD) 400 in communication with a host device (not shown) such as a computer, mobile computing devices such as personal digital assistants, cellular phones, media or MP3 players and the like, and/or other devices via one or more wired or wireless communication links 408. HDD 400 may be connected to memory 409, such as random access memory (RAM), a low latency nonvolatile memory such as flash memory, read only memory (ROM) and/or other suitable electronic data storage. HDD 400 may have magnetic storage medium 406 and a HDD signal processing and/or control circuit 402.

The present invention may be implemented in either or both signal processing and/or control circuits, which are generally identified in FIG. 4(*a*) at 402. In some implementations, signal processing and/or control circuit 402 and/or other circuits (not shown) in HDD 400 may process data, perform coding and/or encryption, perform calculations, and/or format data that is output to and/or received from a magnetic storage medium 406.

Referring now to FIG. 4(*b*), the present invention may be implemented in a digital versatile disc (DVD) drive 410. The present invention may be implemented in either or both signal processing and/or control circuits, which are generally identified in FIG. 4(*b*) at 412, and/or mass data storage 418 of DVD drive 410. Signal processing and/or control circuit 412 and/or other circuits (not shown) in DVD drive 410 may process data, perform coding and/or encryption, perform calculations, and/or format data that is read from and/or data written to an optical storage medium 416. In some implementations, signal processing and/or control circuit 412 and/or other circuits (not shown) in DVD drive 410 can also perform other functions such as encoding and/or decoding and/or any other signal processing functions associated with a DVD drive.

DVD drive 410 may communicate with an output device (not shown) such as a computer, television or other device via one or more wired or wireless communication links 417. DVD drive 410 may communicate with mass data storage 418 that stores data in a nonvolatile manner. Mass data storage 418 may include a HDD such as that shown in FIG. 1 or 4(*a*). The HDD may be a mini HDD that includes one or more platters having a diameter that is smaller than approximately 1.8". DVD drive 410 may be connected to memory 419, such as RAM, ROM, low latency nonvolatile memory such as flash memory, and/or other suitable electronic data storage.

Referring now to FIG. 4(*c*) the present invention may be embodied in a high definition television (HDTV) 420. The present invention may be implemented in either or both signal processing and/or control circuits, which are generally identified in FIG. 4(*c*) at 422, a WLAN interface and/or mass data storage of the HDTV 420. HDTV 420 receives HDTV input signals in either a wired or wireless format and generates HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. At least one HDD may have the configuration shown in either FIG. 1 or 4(*a*) and/or at least one DVD may have the configuration shown in FIG. 4(*b*). The HDD may be a mini HDD that includes one or more platters having a diameter that is smaller than approximately 1.8". HDTV 420 may be connected to memory 428 such as RAM, ROM, low latency nonvolatile memory such as flash memory and/or other suitable electronic data storage. HDTV 420 also may support connections with a WLAN via a WLAN network interface 429.

Referring now to FIG. 4(*d*), the present invention may be implemented in a control system of a vehicle 430, a WLAN interface and/or mass data storage of the vehicle control system. In some implementations, the present invention is implemented in a power-train control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 440 of vehicle 430. Control system 440 may likewise receive signals from input sensors 442 and/or output control signals to one or more output devices 444. In some implementations, control system 440 may be part of an anti-lock braking system (ABS), a navigation system, a telematics system', a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices, for example HDDs and/or DVDs. At least one HDD may have the configuration shown in FIG. 1 or 4(*a*) and/or at least one DVD may have the configuration shown in FIG. 4(*b*). The HDD may be a mini HDD that includes one or more platters having a diameter that is smaller than approximately 1.8". Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown).

Referring now to FIG. 4(*e*), the present invention may be embodied in a cellular phone 450 that may include a cellular antenna 451. The present invention may be implemented in either or both signal processing and/or control circuits, which are generally identified in FIG. 4(*e*) at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with mass data storage 464 that stores data in a nonvolatile manner such as optical and/or magnetic storage devices, for example HDDs and/or DVDs. At least one HDD may have a configuration shown in FIG. 1 or 4(*a*) and/or at least one DVD may have the configuration shown in FIG. 4(*b*). The HDD may be a mini HDD that includes one or more platters having a diameter that is smaller than approximately 1.8". Cellular phone 450 may be connected to memory 466 such as RAM, ROM, low latency nonvolatile memory such as flash memory and/or other suitable electronic data storage. Cellular phone 450 also may support connections with a WLAN via a WLAN network interface 468.

Referring now to FIG. 4(*f*), the present invention may be embodied in a set top box 480. The present invention may be implemented in either or both signal processing and/or control circuits, which are generally identified in FIG. 4(*f*) at 484, a WLAN interface and/or mass data storage of the set top box 480. Set top box 480 receives signals from a source such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices, for example HDDs and/or DVDs. At least one HDD may have a configuration shown in FIG. 1 or 4(*a*) and/or at least one DVD may have the configuration shown in FIG. 4(*b*). The HDD may be a mini HDD that includes one or more platters having a diameter that is smaller than approximately 1.8". Set top box 480 may be connected to memory 494 such as RAM, ROM, low latency nonvolatile memory such as flash memory and/or other suitable electronic data storage. Set top box 480 also may support connections with a WLAN via a WLAN network interface 496.

Referring now to FIG. 4(*g*), the present invention may be embodied in a media player 500. The present invention may be implemented in either or both signal processing and/or control circuits, which are generally identified in FIG. 4(*g*) at 504, a WLAN interface and/or mass data storage of the media player 500. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuits 504 and/or other circuits (not shown) of media player 500 may process data, perform coding and/or encryption, perform calculations, format data and/or perform any other media player function.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include optical and/or magnetic storage devices, for example HDDs and/or DVDs. At least one HDD may have a configuration shown in FIG. 1 or 4(*a*) and/or at least one DVD may have the configuration shown in FIG. 4(*b*). The HDD may be a mini HDD that includes one or more platters having a diameter that is smaller than approximately 1.8". Media player 500 may be connected to memory 514 such as RAM, ROM, low latency nonvolatile memory such as flash memory and/or other suitable electronic data storage. Media player 500 also may support connections with a WLAN via a WLAN network interface 516. Still other implementations in addition to those described above are contemplated.

Referring to FIG. 4(*h*), the present invention may be embodied in a Voice over Internet Protocol (VoIP) phone 550 that may include an antenna 518. The present invention may be implemented in either or both signal processing and/or control circuits, which are generally identified in FIG. 4(*h*) at 520, a wireless interface and/or mass data storage of the VoIP phone 550. In some implementations, VoIP phone 550 includes, in part, a microphone 524, an audio output 526 such as a speaker and/or audio output jack, a display monitor 528, an input device 530 such as a keypad, pointing device, voice actuation and/or other input devices, and a Wireless Fidelity (Wi-Fi) communication module 532. Signal processing and/or control circuits 520 and/or other circuits (not shown) in VoIP phone 550 may process data, perform coding and/or encryption, perform calculations, format data and/or perform other VoIP phone functions.

VoIP phone 550 may communicate with mass data storage 522 that stores data in a nonvolatile manner such as optical and/or magnetic storage devices, for example HDDs and/or DVDs. At least one HDD may have a configuration shown in FIG. 1 or 4(*a*) and/or at least one DVD may have the configuration shown in FIG. 4(*b*). The HDD may be a mini HDD that includes one or more platters having a diameter that is smaller than approximately 1.8". VoIP phone 550 may be connected to memory 534, which may be a RAM, ROM, low latency nonvolatile memory such as flash memory and/or other suitable electronic data storage. VoIP phone 550 is configured to establish communications link with a VoIP network (not shown) via Wi-Fi communication module 532.

All of the discussion above, regardless of the particular implementation being described, is exemplary in nature, rather than limiting. For example, although selected aspects, features, or components of the implementations are depicted as being stored in memories, all or part of the systems and methods consistent with the disk drive system may be stored on, distributed across, or read from other machine-readable media, for example, secondary storage devices such as hard disks, floppy disks, and CD-ROMs; a signal received from a network; or other forms of ROM or RAM either currently known or later developed. All, a subset, or any combination of the acts of FIG. 2 and described above may be recorded or stored as computer readable instructions on a computer readable storage medium.

Furthermore, although specific components of the disk drive system are described, methods, systems, and articles of manufacture consistent with the system may include additional or different components. For example, a processor may be implemented as a microprocessor, microcontroller, application specific integrated circuit (ASIC), discrete logic, or a combination of other types of circuits or logic. Similarly, memories may be DRAM, SRAM, Flash or any other type of memory. Parameters and other data structures may be separately stored and managed, may be incorporated into a single memory or database, or may be logically and physically organized in many different ways. Programs may be parts of a single program, separate programs, or distributed across several memories and processors.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

It is intended that the foregoing detailed description be understood as an illustration of selected forms that the invention can take and not as a definition of the invention. It is only the following claims, including all equivalents, that are intended to define the scope of this invention.

What is claimed is:

1. A method, comprising:
reading a set of stored data at least three times from a storage medium to obtain constituent data having a plurality of data bits;
processing at least part of the constituent data with a first error correction technique and with a second error correction technique, the second error correction technique being different than the first error correction technique; and
deriving a set of derived data after processing the at least part of the constituent data with the first error correction technique and the second error correction technique, the set of derived data being derived based upon a majority status of the data bits at like positions in the constituent data.

2. The method of claim 1, comprising: processing the set of derived data with an error correcting code.

3. The method of claim 1, wherein the first error correction technique is configured to correct errors within a first error zone,
wherein the second error correction technique is configured to correct errors within a second error zone, a size of the first error zone being smaller than a size of the second error zone, and
wherein the size of first error zone and the size of second error zone are determined relative to an amount of error correction code symbols read from the storage medium.

4. The method of claim 1, comprising:
reading the set of stored data and an error correcting code from the storage medium to obtain a first set of data of the constituent data and the error correcting code; and
processing the first set of data with the error correcting code to attempt to correct at least a first possible data error.

5. The method of claim 4, comprising: processing the set of derived data with a third error correction technique.

6. The method of claim 4 wherein the second error correction technique utilizes information about the storage medium.

7. The method of claim 4 wherein the first set of data has a first error zone and the derived data has a second error zone, smaller than the first error zone.

8. The method of claim 4, comprising:
re-reading the set of stored data to obtain a second set of data of the constituent data if the first error correction technique does not provide an error-free data set; and
processing the second set of data with the first error correction technique.

9. The method of claim 8, comprising:
continuing to re-read the set of stored data to obtain the constituent data if the first error correction technique does not provide an error-free data set.

10. A method, comprising:
obtaining data from an initial read operation on a hard disk;
performing a plurality of additional read operations on the same data to obtain a plurality of data sets; and
removing soft errors from the data by analyzing errors associated with the plurality of data sets using a first error correction technique and a second error correction technique, the second error correction technique being different than the first error correction technique, the first and second error correction techniques being associated with a plurality of error zone sizes.

11. The method of claim 10, comprising:
removing hard errors from the data after the soft errors have been removed.

12. The method of claim 10, wherein the plurality of error zone sizes are determined relative to an amount of error correction code symbols read from the hard disk.

13. An apparatus comprising:
a disk drive configured to read a set of stored data from a storage medium at least three times to obtain constituent data having a plurality of data bits; and
at least one processor that is configured to:
process at least part of the constituent data with a first error correction technique and with a second error correction technique, the second error correction technique being different than the first error correction technique; and
derive a set of derived data after processing at least part of the constituent data with the first error correction technique and the second error correction technique, the set of derived data being derived based upon a majority status of the data bits at like positions in the constituent data.

14. The apparatus of claim 13 wherein the at least one processor is configured to process the set of derived data with an error correcting code.

15. The apparatus of claim 13 wherein the disk drive is configured to read the set of stored data and an error correcting code from the storage medium to obtain a first set of data of the constituent data and the error correcting code, and process the first set of data with the error correcting code to attempt to correct at least a first possible data error.

16. The apparatus of claim 13 wherein the second error correction technique utilizes information about the storage medium.

17. The apparatus of claim 13 wherein the set of stored data is read from a data sector on a hard disk.

18. The apparatus of claim 13 wherein the derived data has a first error zone smaller than a second error zone, the second error zone associated with the first set of data.

19. The apparatus of claim 13, wherein the first error correction technique is configured to correct errors within a first error zone,
wherein the second error correction technique is configured to correct errors within a second error zone, a size of the first error zone being smaller than a size of the second error zone, and
wherein the size of first error zone and the size of second error zone are determined relative to an amount of error correction code symbols read from the storage medium.

20. The apparatus of claim 13 wherein the first at least one processor is configured to implement a third error correction technique to process the set of derived data.

21. The apparatus of claim 20 wherein the first at least one processor is a firmware processor.

22. The apparatus of claim 13 wherein the disk drive is configured to re-read the set of stored data to obtain a second set of data of the constituent data if the first error correction technique does not provide an error-free data set, and provide the second set of data to the hardwire processor.

23. The apparatus of claim 22 wherein the disk drive is configured to re-read the set of stored data to obtain the constituent data if the hardwire processor does not provide an error-free data set.

24. An apparatus comprising:
a disk drive configured to obtain data from an initial read operation on a hard disk and to perform a plurality of additional read operations on the same data to obtain a plurality of data sets; and
at least one processor configured to remove a soft error from the data by analyzing errors associated with the plurality of data sets using a first error correction technique and a second error correction technique, the second error correction technique being different than the first error correction technique, the first and second error correction techniques being associated with a plurality of error zone sizes.

25. The apparatus of claim 24 wherein the at least one processor is configured to execute instructions to remove a hard error from the data after the soft errors have been removed.

26. The apparatus of claim 24, wherein the plurality of error zone sizes are determined relative to an amount of error correction code symbols read from the hard disk.

27. An apparatus comprising:
means for reading a set of stored data from a storage medium at least three times to obtain constituent data having a plurality of data bits
means for processing at least part of the constituent data with a first error correction technique and with a second error correction technique, the second error correction technique being different than the first error correction technique; and
means for deriving a set of derived data after processing at least part of the constituent data with the first error correction technique and the second error correction technique, the set of data being derived based upon a majority status of the data bits at like positions in the constituent data.

28. The apparatus of claim 27 comprising means for processing the set of derived data with an error correcting code.

29. The apparatus of claim 27 comprising:
means for applying a third error correction technique to the set of derived data.

30. The apparatus of claim 27 comprising means utilizing information about the storage medium to correct the first set of data.

31. The apparatus of claim 27, wherein the first error correction technique is configured to correct errors within a first error zone,
wherein the second error correction technique is configured to correct errors within a second error zone, a size of the first error zone being smaller than a size of the second error zone, and
wherein the size of first error zone and the size of second error zone are determined relative to an amount of error correction code symbols read from the storage medium.

32. The apparatus of claim 27 comprising:
means for reading the set of stored data and an error correcting code from the storage medium to obtain a first set of data of the constituent data and the error correcting code; and
means for attempting to correct at least a first possible data error in the first set of data.

33. The apparatus of claim 32 wherein the first set of data has a first error zone and the derived data has a second error zone, smaller than the first error zone.

34. The apparatus of claim 27 comprising:
means for re-reading the set of stored data to obtain a second set of data of the constituent data; and
means for applying the second set of data to the first error correction technique.

35. The apparatus of claim 34 comprising means for re-reading the set of stored data to obtain the constituent data if the first error correction technique does not provide an error-free data set.

36. An apparatus comprising:
means for reading data from a hard disk;
means for performing a plurality of additional read operations on the same data to obtain a plurality of data sets; and
means for removing at least one soft error from the data by analyzing errors associated with the plurality of data sets using a first error correction technique and a second error correction technique, the second error correction technique being different than the first error correction technique, the first and second error correction techniques being associated with a plurality of error zone sizes.

37. The apparatus of claim 36, wherein the plurality of error zone sizes are determined relative to an amount of error correction code symbols read from the hard disk.

38. A computer readable storage medium having processor executable instructions to obtain from a disk drive a constituent data set having a plurality of data bits, to apply a first error correction technique and a second error correction technique to at least part of the constituent data, the second error correction technique being different than the first error correction technique, and to derive a set of derived data after applying the first error correction technique and the second error correction technique to at least part of the constituent data set, the set of data being derived based upon a majority status of the data bits at like positions in the constituent data set.

39. The computer readable storage medium of claim 38 having processor executable instructions to process the set of derived data with an error correcting code.

40. The computer readable storage medium of claim 38 having processor executable instructions to receive a first set of data of the constituent data set and an error correcting code from the disk drive and process the first set of data with the error correcting code to attempt to correct a first possible data error.

41. The computer readable storage medium of claim 38, wherein the first error correction technique is configured to correct errors within a first error zone,
  wherein the second error correction technique is configured to correct errors within a second error zone, a size of the first error zone being smaller than a size of the second error zone, and
  wherein the size of first error zone and the size of second error zone are determined relative to an amount of error correction code symbols read from the disk drive.

42. The computer readable storage medium of claim 38 having processor executable instructions to utilize information about a storage medium in communication with the disk drive to correct a first possible data error.

43. The computer readable storage medium of claim 42 having processor executable instructions to remove hard errors from the data after the soft errors have been removed.

44. A computer readable storage medium having processor executable instructions to obtain data from an initial read operation on a hard disk, perform a plurality of additional read operations on the same data to obtain a plurality of data sets, and remove soft errors from the data by analyzing errors associated with the plurality of data sets using a first error correction technique and a second error correction technique, the second error correction technique being different than the first error correction technique, the first and second error correction techniques being associated with a plurality of error zone sizes.

45. The computer readable storage medium of claim 44, wherein the plurality of error zone sizes are determined relative to an amount of error correction code symbols read from the hard disk.

* * * * *